(12) United States Patent
Tsurumi

(10) Patent No.: US 7,242,250 B2
(45) Date of Patent: Jul. 10, 2007

(54) POWER AMPLIFIER

(75) Inventor: Hiroyuki Tsurumi, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 95 days.

(21) Appl. No.: 11/091,430

(22) Filed: Mar. 29, 2005

(65) Prior Publication Data

US 2005/0218987 A1 Oct. 6, 2005

(30) Foreign Application Priority Data

Mar. 30, 2004 (JP) ............................. 2004-099676

(51) Int. Cl.
*H03F 3/26* (2006.01)
(52) U.S. Cl. ...................... 330/265; 330/297; 330/264; 330/271
(58) Field of Classification Search ................ 330/265, 330/297, 264, 271
See application file for complete search history.

(56) References Cited

U.S. PATENT DOCUMENTS

| | | | |
|---|---|---|---|
| 3,887,880 A * | 6/1975 | Leidich ........................ | 330/271 |
| 4,933,645 A * | 6/1990 | Kasai .......................... | 330/255 |
| 6,107,886 A | 8/2000 | Kusakabe et al. | |
| 6,157,258 A * | 12/2000 | Adishian et al. ............. | 330/295 |
| 6,198,325 B1 * | 3/2001 | Ang et al. .................... | 327/259 |
| 6,384,684 B1 * | 5/2002 | Redman-White ........... | 330/263 |

FOREIGN PATENT DOCUMENTS

| | | |
|---|---|---|
| JP | 11-284450 | 10/1999 |
| JP | 11-346126 | 12/1999 |
| JP | 2002-353746 | 12/2002 |

* cited by examiner

*Primary Examiner*—Patricia Nguyen
(74) *Attorney, Agent, or Firm*—Oblon, Spivak, McClelland, Maier & Neustadt, P.C.

(57) ABSTRACT

A power amplifier includes an input circuit, three power supply lines with voltages successively decreasing in an order of first, second and third power supply lines, a push-side driving circuit and a pull-side driving circuit which receive control signals from the input circuit, three driving signal lines which are led out of the driving circuits, three output transistors which have current paths connected at one ends to the first, second and third power supply lines, and have gates connected to the three driving signal lines, respectively, an output terminal which is commonly connected to the other ends of the current paths of the output transistors, an impedance circuit which adjusts a gate impedance of the output transistor connected to the third power supply line, and a feedback circuit connected between the output terminal and the input circuit.

20 Claims, 9 Drawing Sheets

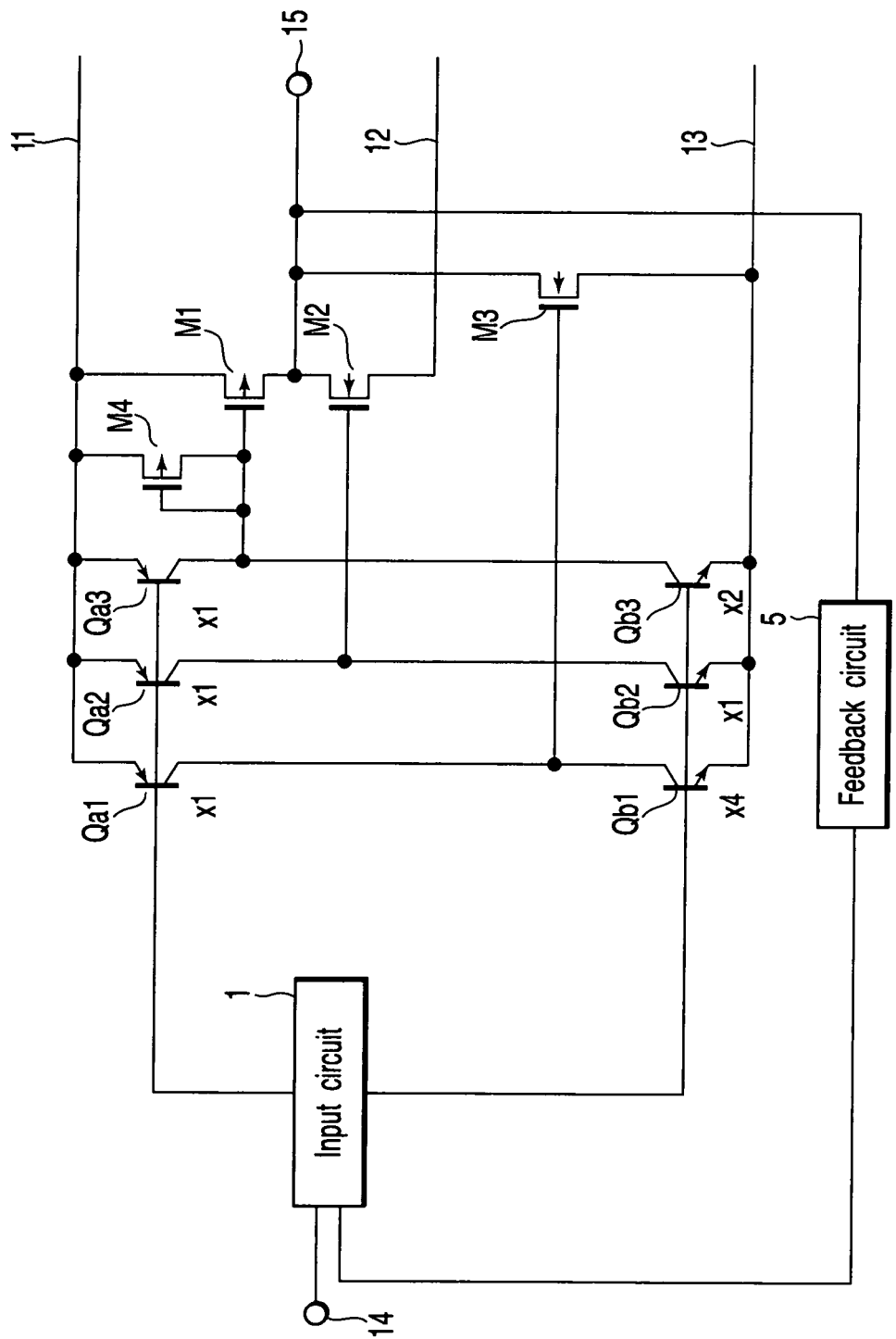
F I G. 6

POWER AMPLIFIER

CROSS-REFERENCE TO RELATED APPLICATIONS

This application is based upon and claims the benefit of priority from prior Japanese Patent Application No. 2004-099676, filed Mar. 30, 2004, the entire contents of which are incorporated herein by reference.

BACKGROUND OF THE INVENTION

1. Field of the Invention

The present invention relates generally to a power amplifier for an audio signal, and more particularly to a semiconductor integrated circuit including a high-efficiency power amplifier that amplifies audio signals of a plurality of channels with high efficiency, for example, a power amplifier circuit suitably applicable to a monolithic power amplifier IC mounted in a car stereo apparatus.

2. Description of the Related Art

In recent years, there has been a trend that car audio apparatuses have more power, multi-channel configurations and multimedia capabilities. With this trend, there has been an increasing demand for a power amplifier with high efficiency and low heat production. Conventionally, various attempts have been made to realize an audio power amplifier system with lower heat production (i.e. lower power consumption) while keeping the level of output power.

For instance, Jpn. Pat. Appln. KOKAI Publication No. 2002-353746 discloses, as an example of an analog-type high-efficiency amplifier system, an amplifier system of a scheme called "keyed B class (KB-class)", wherein a plurality of power amplifiers are vertically stacked between a plurality of power supply rails. In this scheme, for example, two bridge tied load (BTL) amplifiers, each including an output bridge circuit in which output transistors are bridge-connected, are vertically stacked and used. When a power supply voltage is Vcc, a push-pull operation is executed with a Vcc/2 power supply at a time when a small signal is input. On the other hand, when a large signal is input, the push-pull operation is switched to a conventional class AB operation using a Vcc power supply. Thereby, a power amplifier circuit with high efficiency and low heat production is realized (see FIG. 2 to FIG. 4 of the above-mentioned KOKAI 2002-353746).

As will be described later in detail, a conventional KB-class amplifier comprises an output transistor Q1 that is connected to a first power supply rail (power supply line), an output transistor Q2 that is connected to a second power supply rail, and an output transistor Q3 that is connected to a third power supply rail. The output transistors Q1 and Q2 are switched, whereby a push-pull operation and a class AB operation are switched. The KB-class amplifier further comprises potential detection/driving control transistors for controlling the operation states of the transistors Q1 and Q2, an input circuit for delivering an input signal, a driving circuit for amplifying the signal from the input circuit and driving the output transistor Q3 at the rear stage, and a feedback circuit for feeding the signal at an output terminal back to the input circuit.

This type of KB-class amplifier, however, has a problem in that switching of power supply from a plurality of different power supply rails has to be executed in a low output power state, and a sufficiently high efficiency cannot be exhibited. To avoid this, there arises another problem that the chip area of the transistor Q2 has to be increased to sufficiently enhance the load driving performance of the transistor Q2.

Under the circumstances, there has been a demand for a power amplifier system that can amplify audio signals of plural channels with high efficiency, while the amount of heat produced is small. To be more specific, there has been a demand for a circuit scheme for a power amplifier system using a plurality of power supply rails and a plurality of output transistors, wherein smooth switching can be effected between the output transistors and the high-efficiency function can be exhibited to the maximum, without unnecessarily increasing the chip area of the power transistors.

BRIEF SUMMARY OF THE INVENTION

According to a first aspect of the invention, there is provided a power amplifier circuit, which comprises:

an input circuit which receives an input signal and a feedback signal, amplifies the input signal and the feedback signal, and outputs a first control signal and a second control signal;

a first power supply line supplied with a first power supply voltage;

a second power supply line supplied with a second power supply voltage, the second power supply voltage being lower than the first power supply voltage;

a third power supply line supplied with a third power supply voltage, the third power supply voltage being lower than the second power supply voltage;

a push-side driving circuit which is connected to the first power supply line, receives the first control signal, and has three first driving signal output terminals;

a pull-side driving circuit which is connected to the third power supply line, receives the second control signal, and has three second driving signal output terminals;

a first driving signal line, a second driving signal line and a third driving signal line connected between the three first driving signal output terminals and the three second driving signal output terminals, respectively;

a first MOS transistor having a current path connected at one end to the first power supply line, and having a gate connected to the first driving signal line;

a second MOS transistor having a current path connected at one end to the second power supply line, and having a gate connected to the second driving signal line;

a third MOS transistor having a current path connected at one end to the third power supply line, and having a gate connected to the third driving signal line;

an output terminal commonly connected to the other end of the current path of each of the first MOS transistor, the second MOS transistor and the third MOS transistor;

an impedance circuit which includes a fourth MOS transistor, which has a current path connected between the first power supply line and the gate of the first MOS transistor or between the third power supply line and the gate of the third MOS transistor, has a gate connected to the gate of the first MOS transistor or the third MOS transistor, and adjusts a gate impedance of the first MOS transistor or the third MOS transistor; and a feedback circuit which is connected between the output terminal and the input circuit and sends the feedback signal to the input circuit.

According to a second aspect of the invention, there is provided a power amplifier circuit, which comprises:

an input circuit which receives an input signal and a feedback signal, amplifies the input signal and the feedback signal, and outputs a first control signal and a second control signal;

an n-number (n=a natural number of 3 or more) of power supply lines with voltages successively decreasing from a first power supply line to an n-th power supply line;

a push-side driving circuit which is connected to the first power supply line, receives the first control signal, and has an n-number of first driving signal output terminals;

a pull-side driving circuit which is connected to the n-th power supply line, receives the second control signal, and has an n-number of second driving signal output terminals;

an n-number of driving signal lines which are connected between the n-number of driving signal output terminals of the push-side driving circuit and the n-number of driving signal output terminals of the pull-side driving circuit, respectively;

an n-number of MOS transistors which have current paths respectively connected at one ends to the n-number of power supply lines, and have gates respectively connected to the n-number of driving signal lines;

an output terminal commonly connected to the other ends of the current paths of the n-number of MOS transistors;

an impedance circuit which includes an (n+1)th MOS transistor, which has a current path connected between the first power supply line and a gate of the first MOS transistor or between the n-th power supply line and a gate of the n-th MOS transistor, has a gate connected to the gate of the first MOS transistor or the n-th MOS transistor, and adjusts a gate impedance of the first MOS transistor or the n-th MOS transistor; and a feedback circuit which is connected between the output terminal and the input circuit and sends the feedback signal to the input circuit.

BRIEF DESCRIPTION OF THE SEVERAL VIEWS OF THE DRAWING

FIG. 6 is a circuit diagram of a power amplifier circuit according to a fourth embodiment;

DETAILED DESCRIPTION OF THE INVENTION

Figure 1:
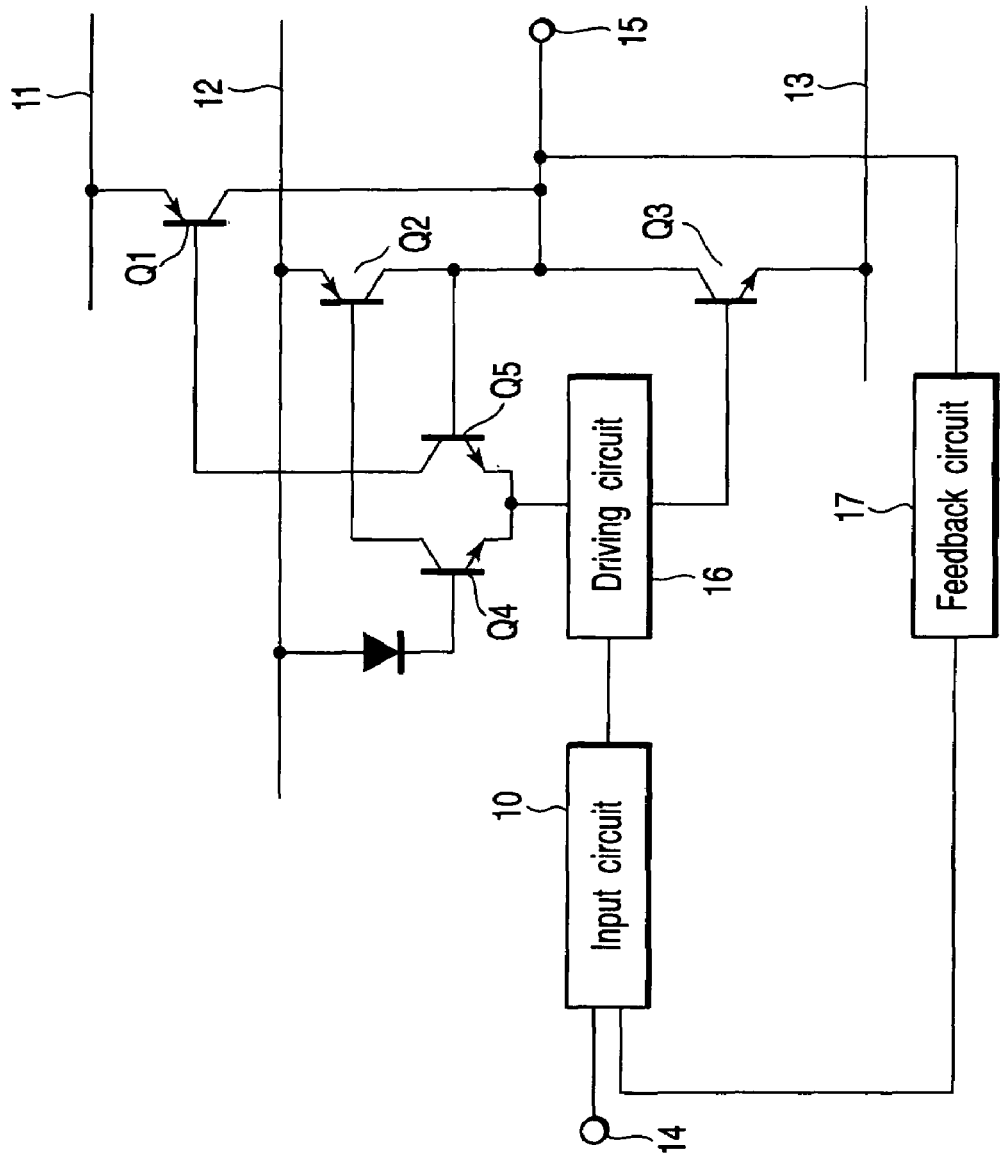
FIG. 1 is a circuit diagram that shows a basic structure of a conventional KB-class power amplifier circuit.

Prior to describing embodiments of the present invention, problems with a conventional KB-class amplifier are described in greater detail with reference to FIG. 1. The KB-class amplifier, as mentioned above, is used with such a configuration that output transistors of normally two amplifier circuits are bridge-connected via a load (e.g. speaker). FIG. 1 shows one of the two amplifier circuits.

In FIG. 1, the KB-class amplifier comprises an output transistor Q1 that is connected to a first power supply rail (power supply line) 11, an output transistor Q2 that is connected to a second power supply rail 12, and an output transistor Q3 that is connected to a third power supply rail 13. The KB-class amplifier further comprises potential detection/driving control transistors Q4 and Q5 for controlling the operation states of the transistors Q1 and Q2, an input circuit 10 for delivering an input signal, a driving circuit 16 for amplifying the signal from the input circuit 10 and driving the output transistor Q3 at the rear stage, and a feedback circuit 17 for feeding the signal at an output terminal 15 back to the input circuit 10.

When the input signal is absent, an output potential is set to become an intermediate potential between the second power supply rail 12 and the third power supply rail 13. If the transistor Q4 is turned on and the output transistor Q2 is rendered operative, the transistor Q5, which, together with the transistor Q4, constitutes a differential switch, is turned off and the output transistor Q1 is rendered inoperative. Thus, when the input signal is absent, the transistors Q2 and Q3 constitute a push-pull power amplifier.

Even in the case where the input signal increases, if the output potential does not exceed the potential of the second power supply rail 12, the transistor Q4 is turned on to render the transistor Q2 operative, and the transistor Q5 is turned off to render the transistor Q1 inoperative. During this time period, the output transistor Q2 is so set as to supply power to the output terminal. If the input signal increases and the output potential becomes close to the potential of the second power supply rail, the transistor Q5 gradually transits to the ON-state and the output transistor Q1 is gradually rendered operative. Thus, during this time period, both the transistors Q1 and Q2 are so set as to supply power to the output terminal.

If the input signal further increases and the output potential exceeds the potential of the second power supply rail, the transistor Q5 is turned on to render the output transistor Q1 operative, and the transistor Q4 is turned off to render the output transistor Q2 inoperative. Thus, in this time period, only the transistor Q1 is so set as to supply power to the output terminal. It is thus possible to realize a power amplifier wherein, in accordance with the output potential, the output power transistors Q1 and Q2 are changed over to execute switching of power supply from the plural different power supply rails.

This scheme, however, has some drawbacks. First, the state of the output terminal is determined by two factors: the operation of the feedback circuit of the power amplifier and the control of the driving state of the power transistor that is determined by the potential detection circuit Q4, Q5. Consequently, the switching between the power transistors Q1 and Q2 cannot smoothly be effected.

Specifically, if the output potential level of the switching of the output transistor Q1, Q2, which is set by the potential detection circuit Q4, Q5, is set to be higher than the collector potential that the transistor Q2 can drive, the switching of the output transistor from Q2 to Q1 cannot be executed. In this case, the collector potential that the transistor Q2 can drive takes a value that is calculated by subtracting the saturation voltage (Vce(sat)) of the transistor Q2 from the second power supply rail potential. This value is determined by the load driving performance of the transistor Q2.

In the prior art, it is thus necessary to set the switching output level to a sufficiently lower potential than a value that is calculated by subtracting the saturation voltage of the transistor Q2 from the second power supply rail potential. In other words, the switching of power supply from the plural different power supply rails has to be executed in a low output power state, and a sufficiently high efficiency cannot be exhibited. To avoid this, the chip area of the transistor Q2 has to be increased to sufficiently enhance the load driving performance of the transistor Q2.

On the other hand, according to the above-described structure of the present invention, for example, in the case of n=3 (n=the number of power supply lines), the first power supply line is set at a power supply voltage (Vcc), the third power supply line is set at a ground potential (GND), and the second power supply line is set at Vcc/2. In this case, the second power supply line (Vcc/2) and third power supply line (GND) are used at a time when a small signal is input. Thus, the push-pull operation by second and third MOS transistors is performed. Thereby, a high-efficiency operation with low power consumption (low heat production) is enabled. At a time when a large signal is input, the first power supply line (Vcc) and third power supply line (GND) are used and an ordinary class AB operation by a first MOS transistor can be performed.

In addition, the structure of the present invention includes three driving signal lines that are led out of a pull-side driving circuit and a push-side driving circuit. The second MOS transistor is driven by the second driving signal line up to the operational limit. When the driving state of the second MOS transistor reaches the operational limit, the first signal driving line starts driving the first MOS transistor on the basis of a feedback signal. Thus, a high-efficiency operation can be exhibited to the maximum. Unlike the case of using a digital switch, the switching from the second MOS transistor to the first MOS transistor can be executed very smoothly. Moreover, the third driving signal line properly sets the idle current of the second and third MOS transistors, thereby enabling the operation with low distortion.

Embodiments of the present invention will now be described with reference to the accompanying drawings.

(First Embodiment)

Figure 2:
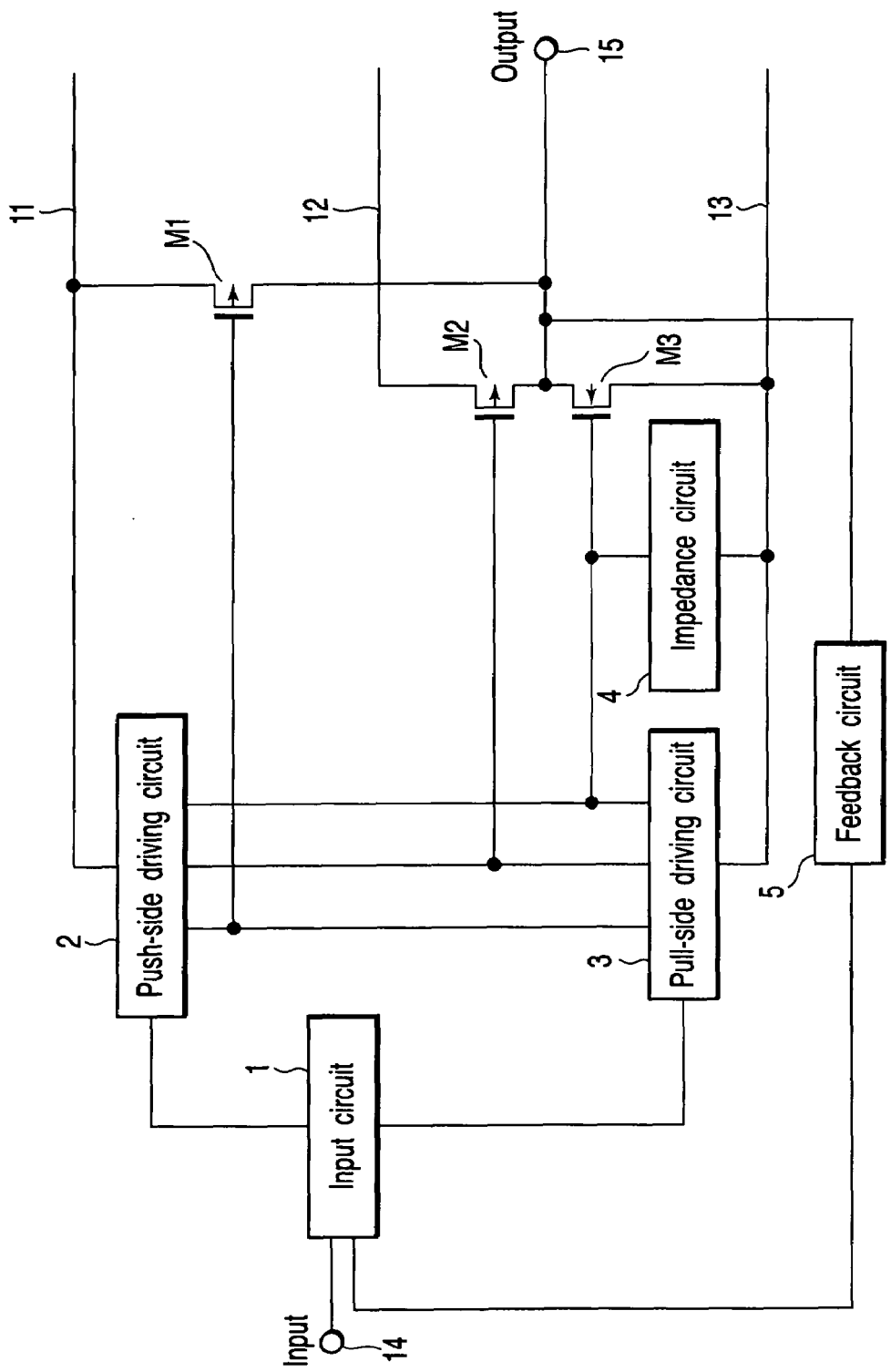
FIG. 2 is a circuit diagram for explaining a concept common to embodiments in which three power supply rails are used.

FIG. 2 is a circuit diagram (block diagram) that illustrates the basic structure of a power amplifier circuit, which is common to first to fifth embodiments of the present invention. An input circuit 1 receives an input signal from an input terminal and a feedback signal from a feedback circuit 5, amplifies the input signal and feedback signal, and delivers a first or a second control signal to a push-side driving circuit 2 or a pull-side driving circuit 3.

The push-side driving circuit 2 is supplied with power from a first power supply rail (power supply line) 11, and the pull-side driving circuit 3 is supplied with power from a third power supply rail (power supply line) 13. Normally, the first power supply rail 11 is connected to a power supply (Vcc) of the apparatus, and the third power supply rail 13 is connected to a ground potential (GND). Each of the push-side driving circuit 2 and pull-side driving circuit 3 has three driving signal output terminals, and the three driving signal output terminals of the push-side driving circuit 2 are connected to the associated three driving signal output terminals of the pull-side driving circuit 3 over driving signal lines. These driving signal lines are referred to as first, second and third driving signal lines, respectively.

An output part comprises three output transistors M1, M2 and M3, which are MOS transistors. The first output transistor (PMOS) M1 has a current path that is connected between the first power supply rail 11 and an output terminal 15. The first output transistor (PMOS) M1 has a gate terminal connected to the first driving signal line. The second output transistor (PMOS) M2 has a current path that is connected between the second power supply rail 12 and the output terminal 15, and has a gate terminal connected to the second driving signal line. The third output transistor (NMOS) M3 has a current path that is connected between the output terminal 15 and the third power supply rail 13, and has a gate terminal connected to the third driving signal line. An impedance circuit 4 for adjusting a gate impedance is connected between the gate terminal of the third output transistor (NMOS) M3 and the third power supply rail 13. This constitutes a power amplifier having three power supply rails. This power amplifier can be built in a KB-class amplifier circuit system.

The input circuit 1 is normally connected between the first power supply rail (Vcc) 11 and the third power supply rail (GND) 13 and activated, but the potentials are not necessarily set at Vcc and GND, and may be set at arbitrary values. In FIG. 2, depiction of power supply connections is omitted. The same applies to the following figures.

Figure 3:
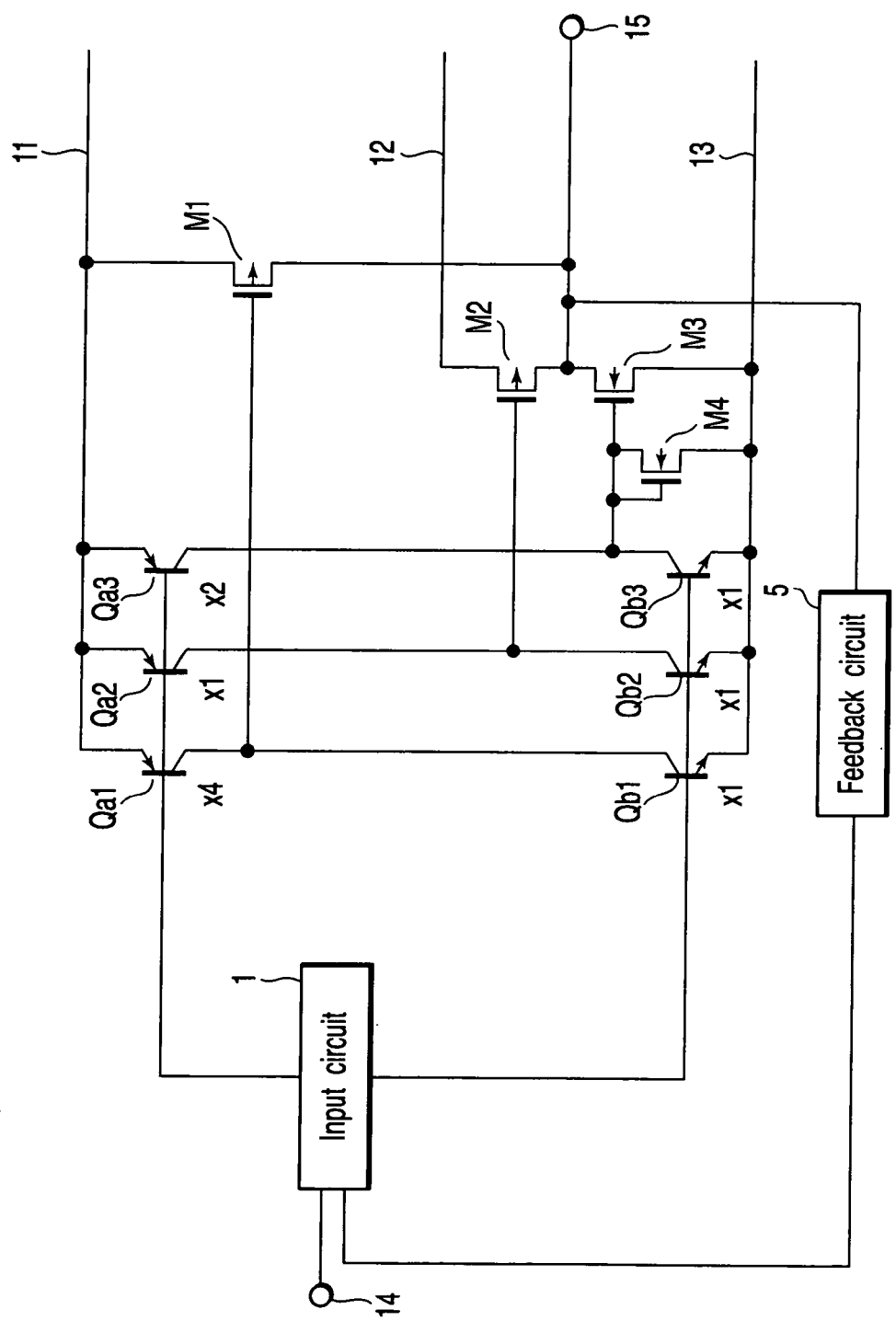
FIG. 3 is a circuit diagram of a power amplifier circuit according to a first embodiment.

FIG. 3 is a circuit diagram that shows a more specific configuration of the power amplifier circuit according to the first embodiment. The input circuit 1, the feedback circuit 5 and the three MOS transistors of the output part are the same as in FIG. 2. The structures of the push-side driving circuit 2, pull-side driving circuit 3 and impedance circuit 4 are specifically depicted.

Driver transistors (bipolar transistors) Qa1, Qa2 and Qa3, which are controlled by the first control signal from the input circuit 1 and function as the push-side driving circuit, have emitter areas with a selective ratio of 4:1:2. On the other hand, driver transistors (bipolar transistors) Qb1, Qb2 and Qb3, which are controlled by the second control signal from the input circuit 1 and function as the pull-side driving circuit, have emitter areas with a selective ratio of 1:1:1.

The driver transistors Qa1, Qa2 and Qa3 and the driver transistors Qb1, Qb2 and Qb3 are mutually connected. The connection line (first driving signal line) between the driver transistors Qa1 and Qb1 is connected to the gate of the first output transistor M1 and drives the first output transistor M1. The connection line (second driving signal line) between the driver transistors Qa2 and Qb2 is connected to the gate of the second output transistor M2 and drives the second output transistor M2. The connection line (third driving signal line) between the driver transistors Qa3 and Qb3 is connected to the gate of the third output transistor M3 and drives the third output transistor M3.

A diode-connected NMOS transistor M4 is connected between the gate of the third output transistor M3 and the third power supply rail. The NMOS transistor M4 adjusts the gate impedance of the third output transistor M3. A feedback circuit 5 is connected between the output terminal 15 and the input circuit 1.

In the state in which no signal is input to the input terminal 14, the first and second control signals are output from the input circuit 1 while the input circuit 1 is being affected by the feedback circuit 5, so that a current of I may flow through the driver transistors Qb1, Qb2 and Qb3. In this case, the current I, which flows through the driver transistor Qb2, flows through the driver transistor Qa2 with no change. Thus, the current that flows through the Qa2 is I. Since the driver transistor Qa3 has double the emitter area of the transistor Qa2, the driver transistor Qa3 is capable of causing a current of 2×I to flow. As a result, the current of I flows through the NMOS transistor M4, and an idle current Iout, which is determined by an area ratio between the NMOS transistor M4 and third output transistor M3 flows through the second and third output transistors M2 and M3.

On the other hand, the driver transistor Qa1 has a four times greater emitter area than the transistor Qa2. Although the driver transistor Qa1 tries to cause a current of 4×I to flow, the current that flows through the driver transistor Qb1 is I. As a result of comparison of currents, the collector-emitter loss decreases, and the potential at the collector of the transistor Qa1 rises close to the first power supply rail potential. Consequently, the first output transistor M1 is turned off. In this case, a push-pull amplifier is constituted by the second and third output transistors M2 and M3 that are connected in series between the second power supply rail 12 and third power supply rail 13.

To begin with, a description is given of the operation in the state in which the input signal level is low and the output signal level is in a range that does not exceed the potential of the second power supply rail 12. Upon receiving the input signal, the input circuit 1 operates to increase the current that is supplied to the driver transistors Qb1, Qb2 and Qb3, while decreasing the current that is supplied to the driver transistors Qa1, Qa2 and Qa3. At the time of no signal, the feedback circuit 5 operates so as to equalize the currents to the transistors Qb2 and Qa2, and the operation state of the input circuit 1 is determined. Thus, the current of the transistor Qb2 easily exceeds the current of the transistor Qa2. In other words, the collector-emitter voltage of the transistor Qb2 decreases, the gate potential of the second output transistor M2 decreases and the current that flows to the second output transistor M2 increases.

Although the current to the driver transistor Qb1 is equal to that to the driver transistor Qb2, the transistor Qa1 is designed to cause a current four times greater than the transistor Qa2 to flow. Thus, in the state in which the input signal level is low, the first output transistor M1 is set to remain in the OFF state. In other words, while the second output transistor M2 is operating to constitute the push-pull amplifier and the feedback circuit 5 is operating, the current that flows to the driver transistors Qb1, Qb2 and Qb3 does not increase over a necessary level. Thus, the driver transistors Qa1 and Qa2 are designed to have an emitter area ratio such that the current of the transistor Qb1 at this time may not exceed the current of the transistor Qa1. Accordingly, in this time period, the power amplifier circuit feeds power to the output terminal 15 via the second power supply rail 12 and second output transistor M2. If this circuit is applied to the above-described KB-class power amplifier, the high-efficiency operation can be executed with the same output power, with low heat production (low power consumption).

In the above-described push-pull operation, if the output current of the driver transistor of the push-side driving circuit 2 increases, the discharge of the gate-source capacitance of the MOS transistor M2 and the charging of the gate-source capacitance of the MOS transistor M1 are performed at the same time. In other words, the driving signal output terminals of the push-side driving circuit and pull-side driving circuit charge or discharge the gate capacitance of the associated MOS transistor via the driving signal line.

If the input signal increases and the output potential becomes close to the potential of the second power supply rail 12, the load driving performance of the second output transistor M2 approaches the limit and the output waveform at the output terminal 15 begins clipping, relative to the potential of the second power supply rail (the function of the saturation voltage of the second output transistor M2 that is determined by so-called Ron). At this time, by the function of the feedback circuit 5, the driving current to the driver transistors Qb1, Qb2 and Qb3 from the input circuit further increases. If the current of the driver transistor Qb1 becomes larger than the current of the transistor Qa1 by the feedback function, the gate voltage of the first output (PMOS) transistor M1 begins to gradually decrease, and the first output transistor M1 gradually transits to the ON state. Thus, in this time period, power is fed to the output terminal 15 by the first and second output transistors M1 and M2.

In the case where the circuit of this embodiment is applied to the KB-class power amplifier system, this time period becomes a period for a switching point between the KB-class high-efficiency operation with the same output power and low heat production (low power consumption) and the conventional AB-class power amplifier.

If the input signal further increases and the output potential exceeds the potential of the second power supply rail 12 by the operation of the first output transistor M1, the gate of the second output transistor M2 is driven but the drain/source potentials of the transistor M2 are reversed. At this time, if the impedance of the second power supply rail in the direction of current flow is set at a high value (e.g. with use of a power supply that employs an emitter follower), the second output transistor M2 can be regarded as being cut off. In other words, the second power supply rail 12 is set to supply current only in one direction to the associated second output transistor M2.

Accordingly, in the state at this time period, only the first output transistor M1 supplies power to the output terminal 15. In this time period, the amplifier operation is similar to that of the conventional class AB power amplifier, and is not a high-efficiency operation with low heat production (low power consumption). However, a higher power can be fed to the output terminal, than in the case where the second output transistor M2 feeds power.

As stated above, it is possible to realize the power amplifier system wherein in accordance with the output potential at the output terminal 15, the operation states of the first and second output transistors M1 and M2 are changed over to execute smooth switching of power supply from the plural different power supply rails. If this amplifier system is applied to the KB-class power amplifier system, it becomes possible to realize a power amplifier system that can exhibit the advantageous effect of low heat production (low power consumption) to the maximum.

As the output power in the operation time period, during which the high-efficiency operation with the same output power and low heat production (low power consumption) and the conventional class AB power amplifier operation are switched, becomes higher, the time period in which audio signals of plural channels are amplified with high efficiency becomes longer. Thereby, a power amplifier system with higher efficiency and lower heat production is realized. In the present embodiment, the high-efficiency operation with the same output power and low heat production (low power consumption) can be executed up to an output signal level corresponding to the operational limit of the second output transistor M2 (the product of the so-called saturation voltage Ron and the current supplied to the load). Therefore, when the power amplifier system is applied to the KB-class power amplifier system, the efficiency of the power amplifier system can be increased to the maximum. Moreover, since the operational switching between the first and second output transistors M1 and M2 is executed by the function of the feedback loop of the power amplifier, very smooth switching is enabled and a stable operation can be performed.

The above-described effect is based on the following technical feature. The power amplifier of the present embodiment includes three driving signal lines that are led out of the pull-side driving circuit and the push-side driving circuit. The second output transistor M2 is driven by the second driving signal line to the operational limit. When the second output transistor M2 reaches the operational limit, the first driving signal line begins to drive the first output transistor M1 on the basis of the feedback signal. In addition, since the third driving signal line properly sets the idle currents of the second and third output transistors M2 and M3, low-distortion amplification can be executed.

Incidentally, in the first embodiment, the emitter areas of the driver transistors of the push-side driving circuit are set to have a selective ratio of 4:1:2, and the emitter areas of the driver transistors of the pull-side driving circuit are set to have a selective ratio of 1:1:1. These ratios are merely exemplified and can be properly changed. In FIG. 3, it suffices that the following relations are satisfied: the ratio of Qa1 emitter area/Qa2 emitter area is larger than the ratio of Qb1 emitter area/Qb2 emitter area, and the ratio of Qa3 emitter area/Qa2 emitter area is larger than the ratio of Qb3 emitter area/Qb2 emitter area.

(Second Embodiment)

Figure 4:
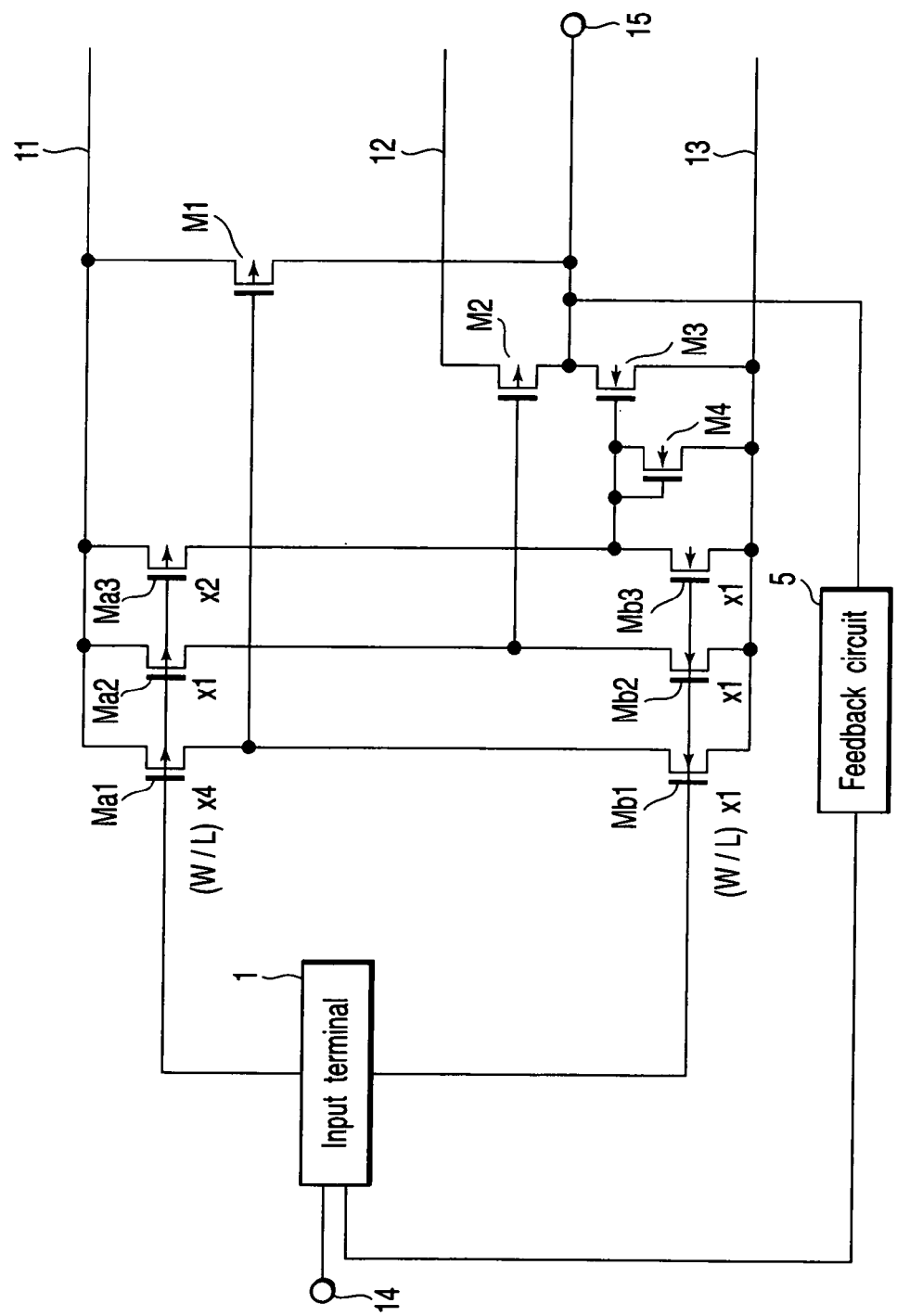
FIG. 4 is a circuit diagram of a power amplifier circuit according to a second embodiment.

FIG. 4 is a circuit diagram of a power amplifier circuit according to a second embodiment of the invention. The second embodiment differs from the first embodiment in that the transistors of the push-side driving circuit 2 are composed of PMOS transistors Ma1, Ma2 and Ma3 and the transistors of the pull-side driving circuit 3 are composed of NMOS transistors Mb1, Mb2 and Mb3. The other parts are common to the first embodiment, and an overlapping description is omitted here.

The push-side driver transistors Ma1, Ma2 and Ma3 have a gate width/length (W/L) ratio or a gate area ratio of 4:1:2, and the pull-side driver transistors Mb1, Mb2 and Mb3 have a gate width/length (W/L) ratio or a gate area ratio of 1:1:1. Note that W is the gate width and L is the gate length.

Like the first embodiment, in the no-signal state in which no signal is input to the input terminal, the input circuit 1 is affected by the feedback circuit 5 so that a current of I may flow through the driver transistors Mb1, Mb2 and Mb3. As a result, the current of I flows through the NMOS transistor M4, and an idle current Iout, which is determined by an area ratio between the NMOS transistor M4 and third output transistor M3, flows through the second and third output transistors M2 and M3.

On the other hand, the driver transistor Ma1 has an area four times greater than the transistor Ma2. Although the driver transistor Ma1 tries to cause a current of 4×I to flow, the current that flows through the driver transistor Mb1 is I. As a result of comparison of currents, the potential at the drain of the driver transistor Ma1 rises close to the potential of the first power supply rail 11. Consequently, the first output transistor M1 is turned off. In this case, a push-pull amplifier is constituted by the second and third output transistors M2 and M3 that are connected in series between the second power supply rail 12 and third power supply rail 13.

In the state in which the input signal level is low and the output signal level is in a range that does not exceed the potential of the second power supply rail 12, the input circuit 1 operates to increase the voltage that is supplied to the driver transistors Mb1, Mb2 and Mb3, while decreasing the voltage that is supplied to the driver transistors Ma1, Ma2 and Ma3. The other operations and the operation at the time when the input signal level increases are understood if the driver transistors Qax and Qbx in the first embodiment are replaced with the driver transistors Max and Mbx. Thus, an overlapping description is omitted.

As has been described above, even if the driver transistors of the pull-side and push-side driving circuits are composed of MOS transistors, the same advantageous effect as with the first embodiment can be obtained.

Incidentally, in the second embodiment, the gate areas (or W/L) of the driver transistors of the push-side driving circuit are set to have a selective ratio of 4:1:2, and the gate areas (or W/L) of the driver transistors of the pull-side driving circuit are set to have a selective ratio of 1:1:1. These ratios are merely exemplified and can be properly changed. In FIG. 4, it suffices that the following relations are satisfied: the ratio of Ma1 gate area/Ma2 gate area is larger than the ratio of Mb1 gate area/Mb2 gate area, and the ratio of Ma3 gate area/Ma2 gate area is larger than the ratio of Mb3 gate area/Mb2 gate area. Note that the above "area" can be replaced with "W/L".

(Third Embodiment)

Figure 5:
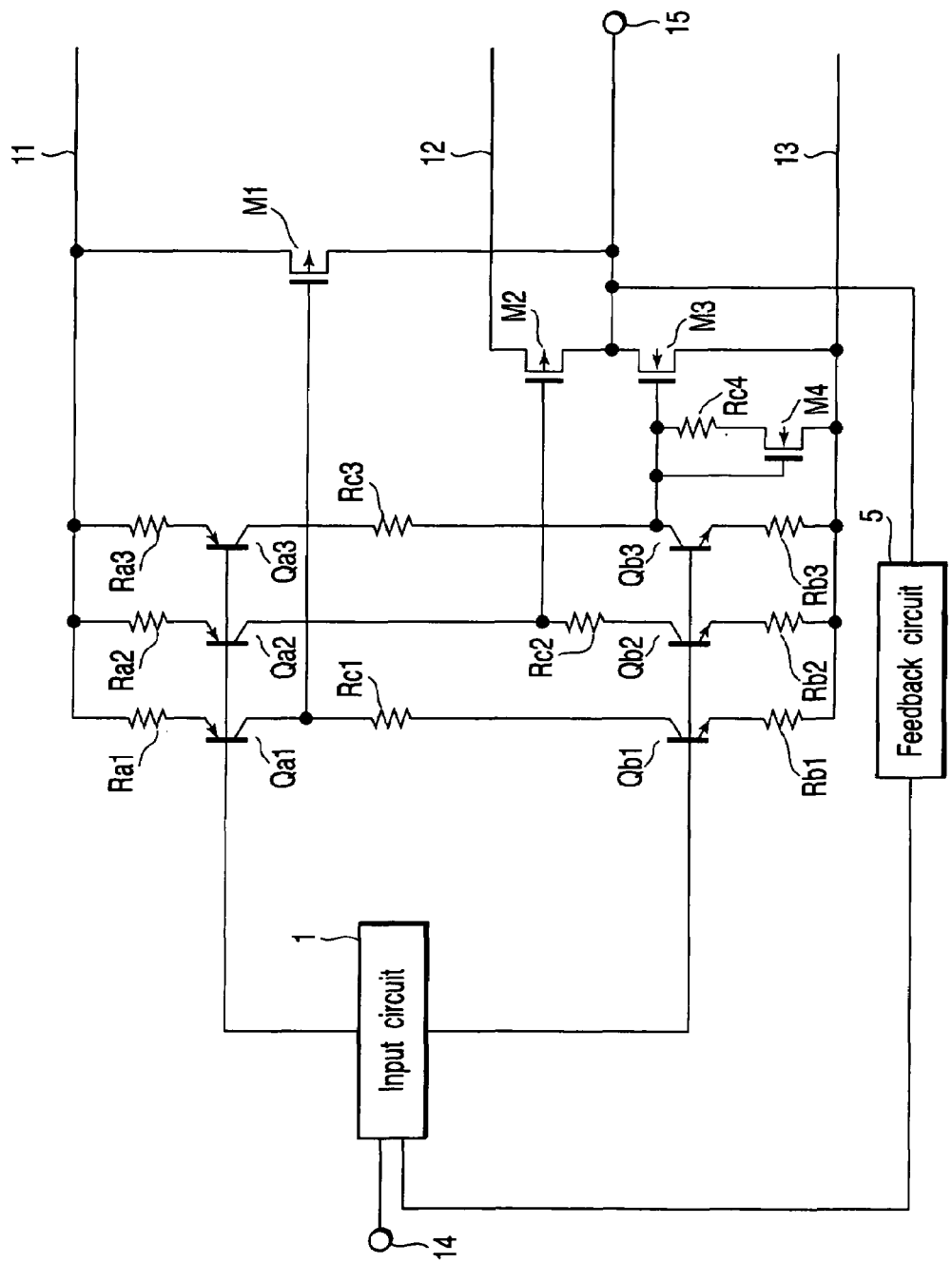
FIG. 5 is a circuit diagram of a power amplifier circuit according to a third embodiment.

FIG. 5 is a circuit diagram of a power amplifier circuit according to a third embodiment of the invention. A first output transistor M1 is connected between the first power supply rail 11 and the output terminal 15. A second output transistor M2 is connected between the second power supply rail 12 and the output terminal 15, and a third output transistor M3 is connected between the output terminal 15 and the third power supply rail 13.

Driver transistors (bipolar transistors) Qa1, Qa2 and Qa3, which are driven by the input circuit 1 and function as the push-side driving circuit 2, have emitter areas with a ratio of 4:1:2, and their emitter resistances Ra1, Ra2 and Ra3 are set at ¼, 1 and ½, respectively. On the other hand, driver transistors (bipolar transistors) Qb1, Qb2 and Qb3, which are driven by the input circuit 1 and function as the pull-side driving circuit, have emitter areas with a ratio of 1:1:1, and their emitter resistances Rb1, Rb2 and Rb3 are set at 1:1:1.

The driver transistors Qa1, Qa2 and Qa3 and the driver transistors Qb1, Qb2 and Qb3 are mutually connected via resistors Rc1, Rc2 and Rc3. A connection node between the driver transistor Qa1 and the resistor Rc1 is connected to the gate of the first output transistor M1, thereby driving the first output transistor M1. A connection node between the driver transistor Qa2 and the resistor Rc2 is connected to the gate of the second output transistor M2, thereby driving the second output transistor M2. A connection node between the driver transistor Qb3 and the resistor Rc3 is connected to the gate of the third output transistor M3, thereby driving the third output transistor M3.

An NMOS transistor M4, which has a gate connected to the gate of the third output transistor M3 and a drain connected to the gate of the third output transistor M3 via a resistor Rc4, is connected between the gate of the third output transistor M3 and the third power supply rail 13. A feedback circuit 5 is connected between the output terminal 15 and the input circuit 1. The resistors Rc1, Rc2 and Rc3 are not essentially required in the operation of the present circuit, but function to limit the maximum currents of the transistors Qb1, Qb2 and Qb3. Thus, when the present circuit is applied to a car audio amplifier, damage can be prevented even if a power supply voltage instantaneously changes to a large degree, and the reliability is enhanced.

The resistor Rc4 is an adjusting resistor for increasing the impedance of the NMOS transistor M4. This resistor is not essentially required, either, in the operation of the present circuit, but a still lower distortion can be realized by increasing the impedance.

The operation of the power amplifier circuit according to the third embodiment is substantially the same as that of the first embodiment, so an overlapping description is omitted here. The circuit configuration of FIG. 5 provides the same advantageous effect as with the circuit configuration of FIG. 2.

Incidentally, in the third embodiment, the emitter areas of the driver transistors of the push-side driving circuit are set to have a selective ratio of 4:1:2, the resistances of the emitter resistors of the push-side driving circuit are set to have a selective ratio of ¼:1:½, and the emitter areas of the driver transistors of the pull-side driving circuit are set to have a selective ratio of 1:1:1, the resistances of the emitter resistors of the pull-side driving circuit are set to have a selective ratio of 1:1:1. These ratios are merely exemplified and can be properly changed. In FIG. 5, it suffices that the following relations are satisfied: the ratio of Qa1 emitter area/Qa2 emitter area is larger than the ratio of Qb1 emitter area/Qb2 emitter area, and the ratio of Qa3 emitter area/Qa2 emitter area is larger than the ratio of Qb3 emitter area/Qb2 emitter area, and further the resistance ratio of Ra1/Ra2 is smaller than Rb1/Rb2, and Ra3/Ra2 is smaller than Rb3/Rb2.

(Fourth Embodiment)

FIG. 6 is a circuit diagram of a power amplifier circuit according to a fourth embodiment of the invention. A first output transistor M1 is connected between the first power supply rail 11 and the output terminal 15. A second output transistor M2 is connected between the output terminal 15 and the second power supply rail 12, and a third output transistor M3 is connected between the output terminal 15 and the third power supply rail 13. Push-side driver transistors (bipolar) Qa1, Qa2 and Qa3, which are driven by the input circuit 1, have emitter areas with a selective ratio of 1:1:1. On the other hand, pull-side driver transistors (bipolar) Qb1, Qb2 and Qb3, which are driven by the input circuit 1, have emitter areas with a selective ratio of 4:1:2. The driver transistors Qa1, Qa2 and Qa3 and the driver transistors Qb1, Qb2 and Qb3 are mutually connected. The connection line (first driving signal line) between the driver transistors Qa1 and Qb1 is connected to the gate of the third output transistor M3 and drives the third output transistor M3. The connection line (second driving signal line) between the driver transistors Qa2 and Qb2 is connected to the gate of the second output transistor M2 and drives the second output transistor M2. The connection line (third driving signal line) between the driver transistors Qa3 and Qb3 is connected to the gate of the first output transistor M1 and drives the first output transistor M1.

A diode-connected PMOS transistor M4 is connected between the gate of the first output transistor M1 and the first power supply rail 11. A feedback circuit 5 is connected between the output terminal 15 and the input circuit 1.

In the no-signal state in which no signal is input to the input terminal 14, the control signals are output from the input circuit 1 while the input circuit 1 is affected by the feedback circuit 5, so that a current of I may flow through the driver transistors Qa1, Qa2 and Qa3. In this case, the current I, which flows through the driver transistor Qa2, flows through the driver transistor Qb2 with no change. Thus, the current that flows through the Qb2 is I. Since the driver transistor Qb3 has double the emitter area of the transistor Qb2, the driver transistor Qb3 is capable of causing a current of 2×I to flow. As a result, the current of I flows through the PMOS transistor M4, and an idle current Iout, which is determined by an area ratio between the PMOS transistor M4 and first output transistor M1, flows through the first and second output transistors M1 and M2.

On the other hand, the driver transistor Qb1 has an emitter area four times greater than the transistor Qb2. Although the driver transistor Qb1 tries to cause a current of 4×I to flow, the current that flows through the driver transistor Qa1 is I. As a result, the collector-emitter loss decreases, and the potential at the collector of the transistor Qb1 lowers close to the first power supply rail potential. Consequently, the third output transistor M3 is turned off. In this case, a push-pull amplifier is constituted by the first and second output transistors M1 and M2 that are connected in series between the first power supply rail 11 and second power supply rail 12.

To begin with, a description is given of the operation in the state in which the input signal level is low and the output signal level is in a range that does not exceed the potential of the second power supply rail 12. Upon receiving a negative input signal, the input circuit 1 operates to increase the current that is supplied to the driver transistors Qa1, Qa2 and Qa3, while decreasing the current that is supplied to the driver transistors Qb1, Qb2 and Qb3. At the time of no signal, the feedback circuit 5 operates so as to equalize the currents to the transistors Qa2 and Qb2, and the operation state of the input circuit 1 is determined. Thus, the current of the transistor Qa2 easily exceeds the current of the transistor Qb2, and the current that flows to the second output transistor M2 increases. Although the current to the driver transistor Qa1 is equal to that to the driver transistor Qa2, the transistor Qb1 is designed to cause a current four times greater than the transistor Qb2 to flow. Thus, in the state in which the input signal level is low, the third output transistor M3 is set to remain in the OFF state. In other words, while the second output transistor M2 is operating to constitute the push-pull amplifier and the feedback circuit 5 is operating, the current that flows to the driver transistors Qa1, Qa2 and Qa3 does not increase over a necessary level. Thus, the driver transistors Qb1 and Qb2 are designed to have an emitter area ratio such that the current of the transistor Qa1 at this time may not exceed the current of the transistor Qb2. Accordingly, in this time period, the power amplifier circuit feeds power to the output terminal 15 via the second power supply rail 12 and second output transistor M2. If this circuit is applied to the above-described KB-class power amplifier, a high-efficiency operation can be executed with the same output power and low heat production (low power consumption).

If the input signal increases and the output potential becomes close to the potential of the second power supply rail 12, the load driving performance of the second output transistor M2 approaches the limit and the output waveform at the output terminal 15 begins clipping, relative to the potential of the second power supply rail (the function of the saturation voltage of the second output transistor M2 that is determined by so-called Ron). At this time, by the feedback function of the feedback circuit 5, the driving current to the driver transistors Qa1, Qa2 and Qa3 from the input circuit 1 further increases. If the current of the driver transistor Qa1 becomes larger than the current of the transistor Qb1 by the feedback function, the gate voltage of the third output transistor M3 begins to gradually decrease, and the third output transistor M3 gradually transits to the ON state. Thus, in this time period, power is fed to the output terminal 15 by the second and third output transistors M2 and M3.

In the case where the circuit of this embodiment is applied to the KB-class power amplifier system, this time period becomes a period for a switching point between the high-efficiency operation with the same output power and low heat production (low power consumption) and the conventional AB-class power amplifier.

If the input signal further increases and the output potential exceeds the potential of the second power supply rail 12 by the operation of the third output transistor M3, the gate of the second output transistor M2 is driven but the drain/source potentials of the transistor M2 are reversed. At this time, if the impedance of the second power supply rail in the direction of current flow is set at a high value, the second output transistor M2 can be regarded as being cut off. Accordingly, in the state at this time period, only the third output transistor M3 supplies power to the output terminal. In this time period, the amplifier operation is similar to that of the conventional class AB class power amplifier, and is not a high-efficiency operation with low heat production (low power consumption). However, a higher power can be fed to the output terminal, than in the case where the second output transistor M2 feeds power.

As stated above, it is possible to realize a power amplifier system wherein in accordance with the output potential, the operation states of the second and third output transistors M2 and M3 are changed over to execute switching of power supply from the plural different power supply rails. If this amplifier system is applied to the KB-class power amplifier system, it becomes possible to realize a power amplifier system that can exhibit the advantageous effect of low heat production (low power consumption) to the maximum.

The present embodiment has a partial vertical-symmetric configuration in association with the structure of the first embodiment that is shown in FIG. 3. Specifically, when a small input signal is input, the push-pull configuration is formed by the first and second MOS transistors M1 and M2. The MOS transistor M4 adjusts the gate impedance of the transistor M1, and the area ratio of the driver transistors Qb1, Qb2 and Qb3 is changed. If the circuit of FIG. 6 is stacked over the circuit of FIG. 3, a 2-stage-stacked KB-class amplifier system is easily constituted. In the present embodiment, too, the same advantageous effect as with the first embodiment can be obtained.

Furthermore, like the third embodiment shown in FIG. 5, a resistor for limiting a maximum current may be inserted in each driving signal line of the driving circuit or in each current path. In the present embodiment, bipolar transistors are used as the transistors that constitute the driving circuits. The bipolar transistors, however, may be replaced with MOS transistors, and a 2-stage-stacked KB-class amplifier system may be constituted in combination with the circuit of FIG. 4.

Incidentally, in the fourth embodiment, the emitter areas of the driver transistors of the push-side driving circuit are set to have a selective ratio of 1:1:1, and the emitter areas of the driver transistors of the pull-side driving circuit are set to have a selective ratio of 4:1:2. These ratios are merely exemplified and can be properly changed. In FIG. 6, it suffices that the following relations are satisfied: the ratio of Qb1 emitter area/Qb2 emitter area is larger than the ratio of Qa1 emitter area/Qa2 emitter area, and the ratio of Qb3 emitter area/Qb2 emitter area is larger than the ratio of Qa3 emitter area/Qa2 emitter area.

When the emitter resistors are inserted as in the third embodiment, the resistance ratio of Rb1/Rb2 is smaller than Ra1/Ra2, and Rb3/Rb2 is smaller than Ra3/Ra2.

Furthermore, the transistors of the driver circuits shown in FIG. 6 can be replaced with MOS transistors as in the second embodiments (FIG. 4). In this case, it suffices that the following relations are satisfied: the ratio of Mb1 gate area/Mb2 gate area is larger than the ratio of Ma1 gate area/Ma2 gate area, and the ratio of Mb3 gate area/Mb2 gate area is larger than the ratio of Ma3 gate area/Ma2 gate area. Note that the above "area" can be replaced with "W/L".

(Fifth Embodiment)

Figure 7:
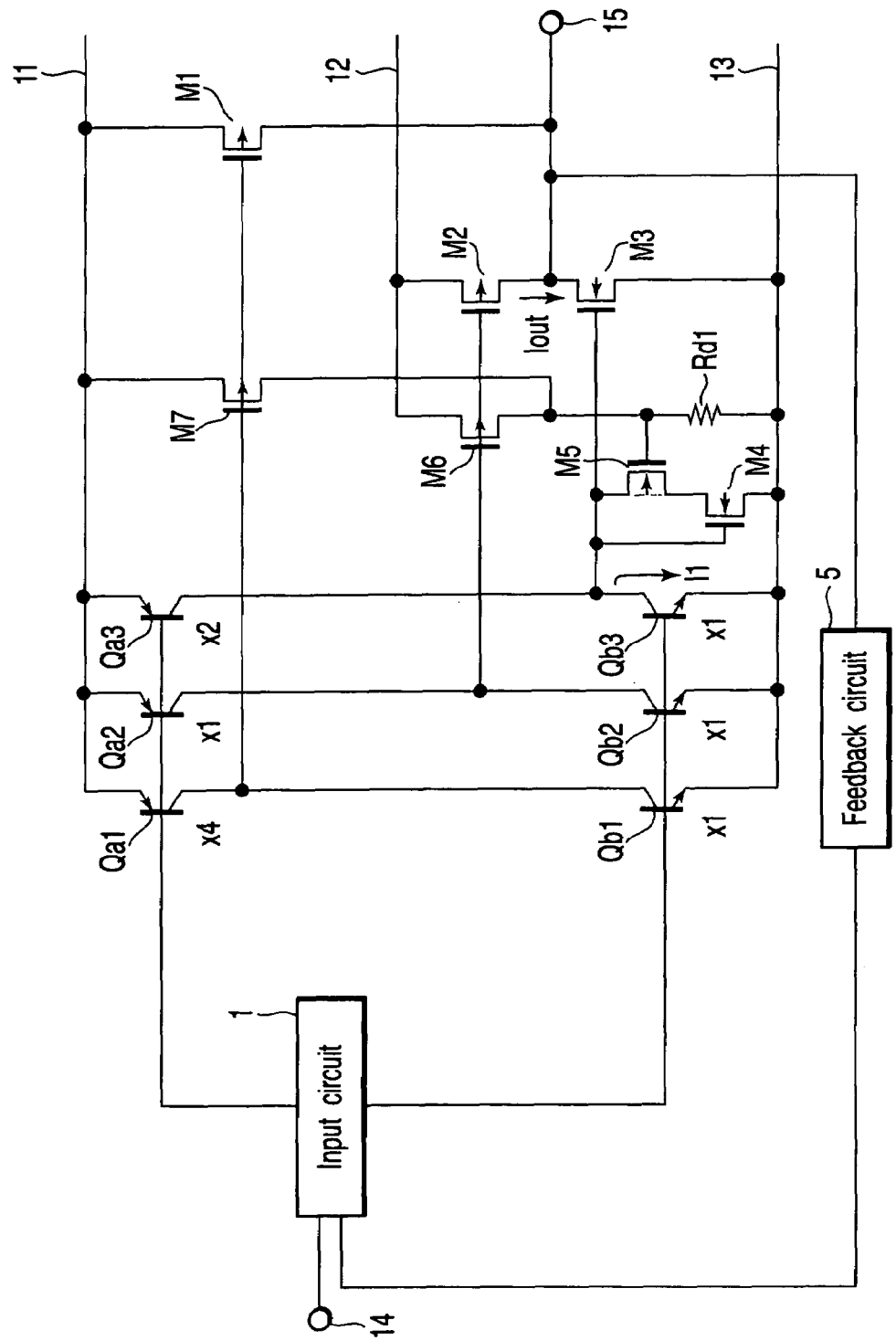
FIG. 7 is a circuit diagram of a power amplifier circuit according to a fifth embodiment.

FIG. 7 is a circuit diagram that shows a power amplifier circuit according to a fifth embodiment of the invention. The fifth embodiment is similar to the first embodiment shown in FIG. 3. Only different parts are described, and an overlapping description is omitted. Like the first embodiment, driver transistors (bipolar transistors) Qa1, Qa2 and Qa3, which function as the push-side driving circuit, have emitter areas with a selective ratio of 4:1:2. On the other hand, driver transistors (bipolar transistors) Qb1, Qb2 and Qb3, which function as the pull-side driving circuit, have emitter areas with a selective ratio of 1:1:1.

The driver transistors Qa1, Qa2 and Qa3 and the driver transistors Qb1, Qb2 and Qb3 are mutually connected. The connection line (first driving signal line) between the driver transistors Qa1 and Qb1 is connected to the gate of a PMOS transistor M7 and the gate of the first output transistor M1 and drives the transistors M7 and M1. The connection line (second driving signal line) between the driver transistors Qa2 and Qb2 is connected to the gate of a PMOS transistor M6 and the gate of the second output transistor M2 and drives the transistors M6 and M2. The connection line (third driving signal line) between the driver transistors Qa3 and Qb3 is connected to the gate of the third output transistor M3 and drives the third output transistor M3.

NMOS transistors M5 and M4 are connected in a vertically stacked fashion between the gate of the third output transistor M3 and the third power supply rail. The gate of the NMOS transistor M4 is connected to the gate of the third output transistor M3, and the gate of the NMOS transistor M5 is connected to one end of a resistor Rd1. The other end of the resistor Rd1 is connected to the third power supply rail 13. The PMOS transistors M7 and M6 have gates that are connected to the gates of the first and second output (PMOS) transistors M1 and M2, respectively. The PMOS transistor M7 is connected between the first power supply rail 11 and the aforementioned one end of the resistor Rd1, and the PMOS transistor M6 is connected between the second power supply rail 12 and the aforementioned one end of the resistor Rd1. A feedback circuit 5 is connected between the output terminal 15 and the input circuit 1.

The basic operation of the present embodiment is the same as that of the first embodiment, so an overlapping description is omitted and only the operation of different circuit components is described. When an input signal is absent, a current, which is proportional to the idle current Iout flowing through the second and third output transistors M2 and M3, flows through the PMOS transistor M6. The current that flows through the PMOS transistor M6 flows through the resistor Rd1, thereby turning on the NMOS transistor M5. Upon the turn-on of the NMOS transistor M5, the NMOS transistor M4 is turned on. Upon the turn-on of the NMOS transistor M4, a current I1 flows through the NMOS transistors M5 and M4 from the third driving signal line when the input signal is absent.

If the current I1 flows through the NMOS transistor M4, a gate-source voltage VGS4 of the transistor M4 occurs. The voltage VGS4 becomes a gate-source voltage of the third output transistor M3, and thus the voltage VGS4 that is produced by the current I1 can exactly be supplied to the third output transistor M3. Therefore, non-uniformity in idle current Iout is decreased.

Then, if the third output transistor M3 is driven by the signal from the third driving signal line, the second output transistor M2 is cut off. Upon the cut-off of the second output transistor M2, the PMOS transistor M6 is cut off. Upon the cut-off of the PMOS transistor M6, the NMOS transistor M5 is also cut off.

Thereby, the current that flows to the NMOS transistor M4 from the third driving signal line is reduced to zero, and the gate impedance of the third output transistor M3, as viewed from the driver transistor side, increases. Accordingly, the gain of the entirety of the amplifier circuit increases, and low-distortion amplification is enabled.

Amplification with still lower distortion can be performed by greatly reducing the area of the NMOS transistor M5 and decreasing the ratio of the gate impedance of the third output transistor M3 at the time when a signal from the third driving signal line is absent and when the third output transistor M3 is driven. Even if the area of the NMOS transistor M5 is extremely reduced, the gate-source voltage of the NMOS transistor M4 at the time of absence of a signal is not varied. Thus, non-uniformity in the idle current Iout does not increase. Moreover, since the area of the NMOS transistor M5 can be made much smaller than the area of the first output transistor M1, the chip size can be reduced.

The operation of the PMOS transistor M6 that has the gate commonly connected to the gate of the second output transistor M2 has been described. The same applies to the PMOS transistor M7 that has the gate commonly connected to the gate of the first output transistor M1.

Figure 8:
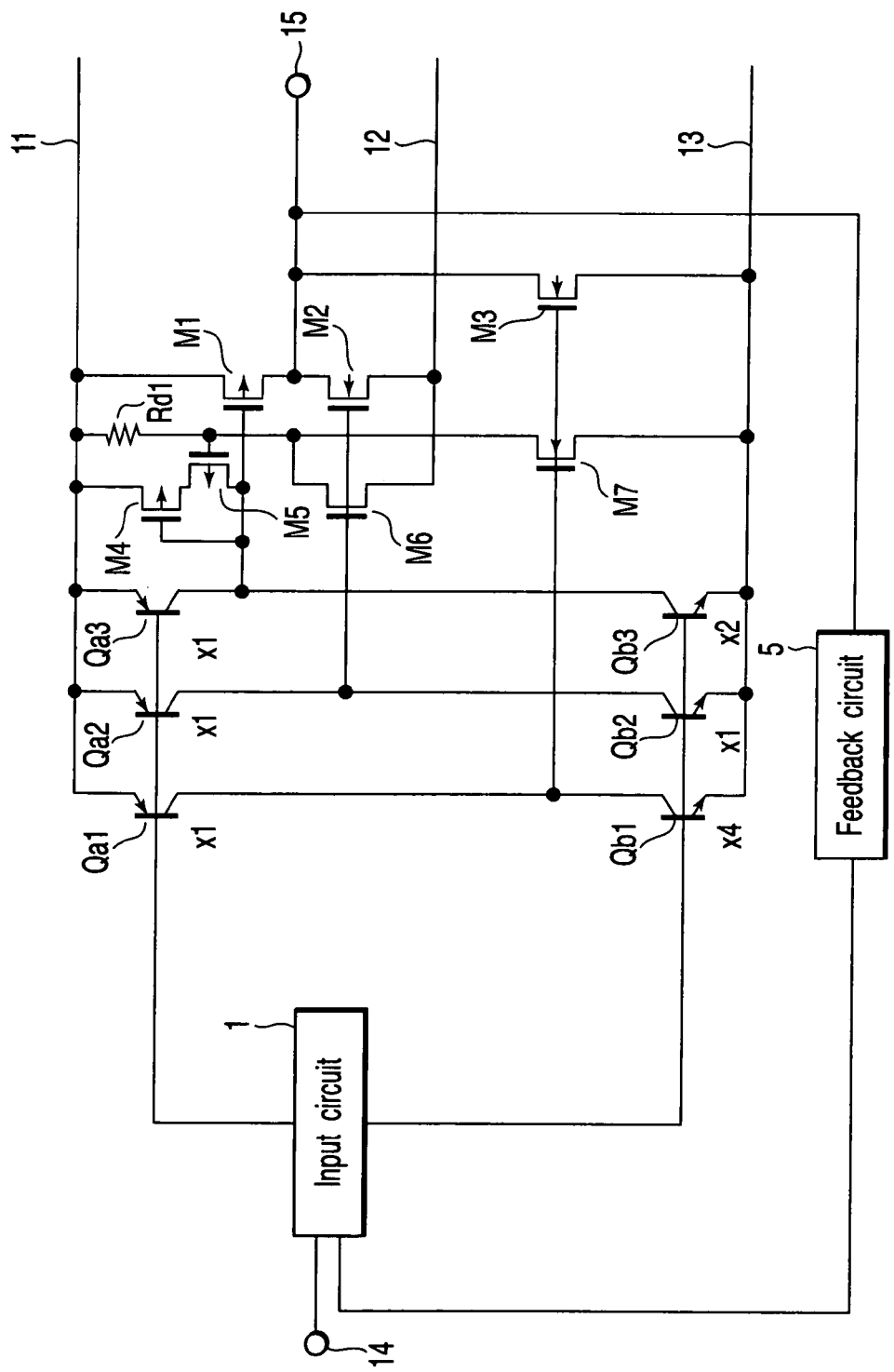
FIG. 8 is a circuit diagram of a power amplifier circuit according to a modification of the fifth embodiment.

As has been described above, according to the fifth embodiment, the same advantageous effect as with the first embodiment can be obtained. Thus, without increasing the non-uniformity in idle current, almost complete low-distortion amplification can be performed. In the case where the circuit configuration of the present embodiment is to be applied to a 2-stage-stacked KB-class amplifier system, this circuit configuration may be combined with the circuit shown in FIG. 8. A description of the structure shown in FIG. 8 is omitted, since the structure of FIG. 8 and the structure of FIG. 7 are symmetric.

(Sixth Embodiment)

Figure 9:
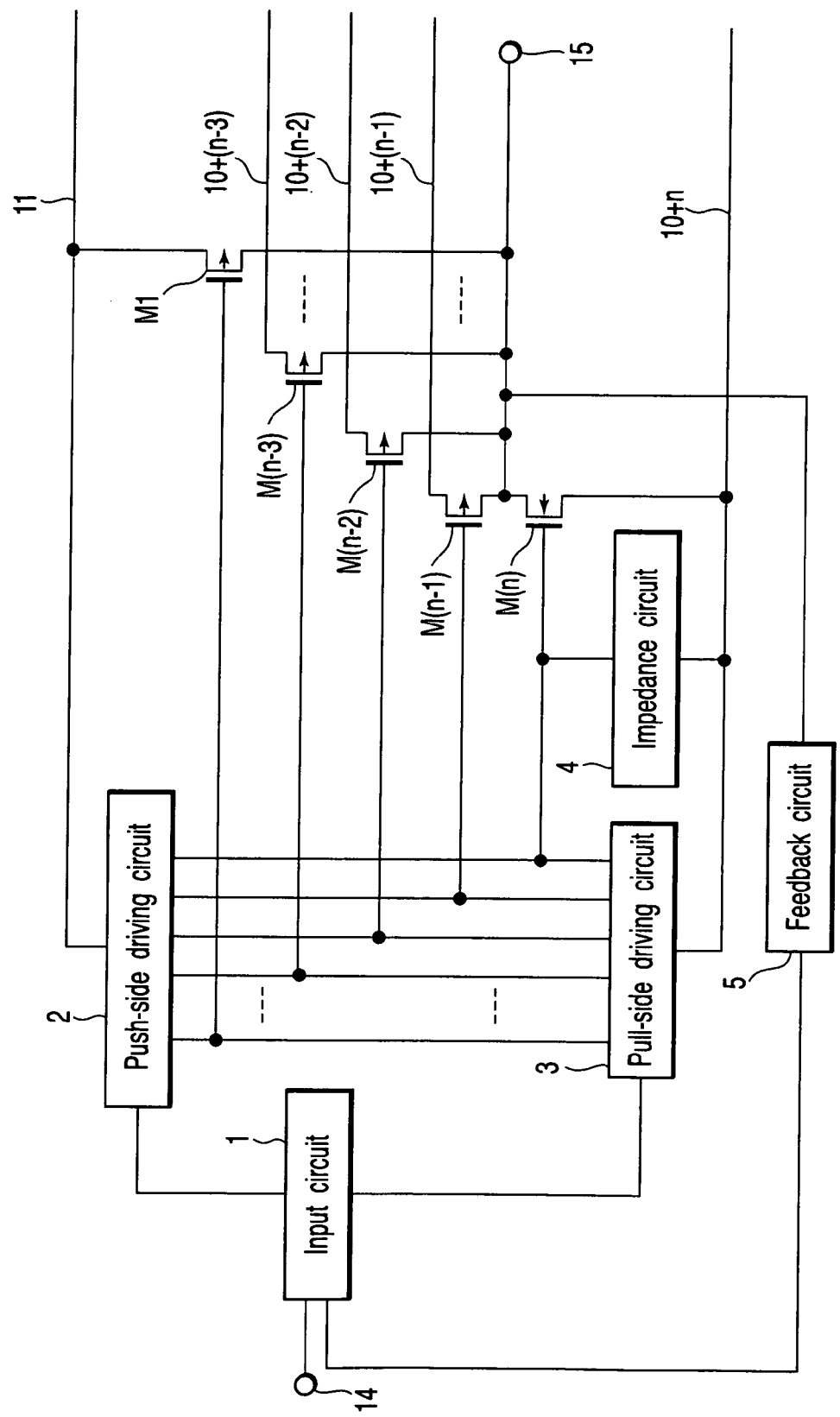
FIG. 9 is a circuit diagram of a power amplifier circuit according to a sixth embodiment, explaining the concept that is common to cases of using an n-number of power supply rails.

In the first to fifth embodiments, three power supply rails are provided. In the present invention, however, the number of power supply lines is not limited to three. FIG. 9 is a circuit diagram of a power amplifier circuit according to a sixth embodiment of the invention. In the sixth embodiment, an n-number (n=an integer of 3 or more) of power supply rails are provided.

In addition, an n-number of output MOS transistors M1 to Mn are provided. The push-side driving circuit 2 and the pull-side driving circuit 3 are connected over an n-number of driving signal lines. The n-number of driving signal lines are connected to the gates of the n-number of output MOS transistors. An impedance circuit 4 is connected between the gate of the output transistor Mn and the n-th power supply rail, and a feedback circuit 5 is connected between the output terminal 15 and input circuit 1.

FIG. 9 shows the n-stage structure that corresponds to the structure of FIG. 2 (or FIG. 3). Needless to say, it is possible to adopt an n-stage structure that corresponds to the structure of FIG. 6 and constitutes a symmetrical configuration along with the n-stage structure of FIG. 9. Alternatively, a current limiting resistor may be inserted in the driving circuit, as shown in FIG. 5. Alternatively, the driving circuit may be composed of MOS transistors, as shown in FIG. 4. Alternatively, a distortion-reducing circuit may be inserted, as shown in FIGS. 7 and 8.

In a case where an n-number of power supply rails are provided as described above, the theoretical power efficiency is improved by an n-number of times, compared to a class B amplifier. In addition, the theoretical power consumption (heat production) is remarkably improved.

The embodiments of the power amplifier circuit of the invention have been described, referring to the examples wherein the power amplifier circuit is applied to the KB-class amplifier. The present invention is also applicable to a G-class power amplifier system wherein a plurality of power supplies are switched in accordance with the signal level, and to an H-class power amplifier system wherein a power supply potential is temporarily lifted up when the signal level is high.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A power amplifier circuit comprising:
   an input circuit which receives an input signal and a feedback signal, amplifies the input signal and the feedback signal, and outputs a first control signal and a second control signal;
   a first power supply line supplied with a first power supply voltage;
   a second power supply line supplied with a second power supply voltage, the second power supply voltage being lower than the first power supply voltage;
   a third power supply line supplied with a third power supply voltage, the third power supply voltage being lower than the second power supply voltage;
   a push-side driving circuit which is connected to the first power supply line, receives the first control signal, and has three first driving signal output terminals;
   a pull-side driving circuit which is connected to the third power supply line, receives the second control signal, and has three second driving signal output terminals;
   a first driving signal line, a second driving signal line and a third driving signal line connected between the three first driving signal output terminals and the three second driving signal output terminals, respectively;
   a first MOS transistor having a current path connected at one end to the first power supply line, and having a gate connected to the first driving signal line;
   a second MOS transistor having a current path connected at one end to the second power supply line, and having a gate connected to the second driving signal line;
   a third MOS transistor having a current path connected at one end to the third power supply line, and having a gate connected to the third driving signal line;
   an output terminal commonly connected to the other end of the current path of each of the first MOS transistor, the second MOS transistor and the third MOS transistor;

an impedance circuit which includes a fourth MOS transistor, which has a current path connected between the first power supply line and the gate of the first MOS transistor or between the third power supply line and the gate of the third MOS transistor, has a gate connected to the gate of the first MOS transistor or the third MOS transistor, and adjusts a gate impedance of the first MOS transistor or the third MOS transistor; and a feedback circuit which is connected between the output terminal and the input circuit and sends the feedback signal to the input circuit.

2. The power amplifier circuit according to claim 1, wherein when the input signal increases, the first control signal decreases output currents of the first driving signal output terminals and the second control signal increases output currents of the second driving signal output terminals.

3. The power amplifier circuit according to claim 1, wherein the first driving signal output terminals and the second driving signal output terminals charge or discharge gate capacitances of the first MOS transistor, the second MOS transistor and the third MOS transistor via the first driving signal line, the second driving signal line and the third driving signal line, respectively.

4. The power amplifier circuit according to claim 1, wherein when the input signal is absent, the impedance circuit determines a current which flows to the first MOS transistor and the second MOS transistor, or the second MOS transistor and the third MOS transistor.

5. The power amplifier circuit according to claim 1, wherein the second power supply line supplies a current only in one direction to the second MOS transistor.

6. The power amplifier circuit according to claim 1, wherein the push-side driving circuit includes a first bipolar transistor, a second bipolar transistor and a third bipolar transistor, which have current paths connected at one ends to the first driving signal line, the second driving signal line and the third driving signal line, respectively, the pull-side driving circuit includes a fourth bipolar transistor, a fifth bipolar transistor and a sixth bipolar transistor, which have current paths connected at one ends to the first driving signal line, the second driving signal line and the third driving signal line, respectively, a ratio of an emitter area of the first bipolar transistor with respect to an emitter area of the second bipolar transistor is greater than a ratio of an emitter area of the fourth bipolar transistor with respect to an emitter area of the fifth bipolar transistor, and a ratio of an emitter area of the third bipolar transistor with respect to the emitter area of the second bipolar transistor is greater than a ratio of an emitter area of the sixth bipolar transistor with respect to the emitter area of the fifth bipolar transistor.

7. The power amplifier circuit according to claim 6, wherein the push-side driving circuit includes a first resistor, a second resistor and a third resistor, to which the other ends of the current paths of the first bipolar transistor, the second bipolar transistor and the third bipolar transistor are connected, respectively, the pull-side driving circuit includes a fourth resistor, a fifth resistor and a sixth resistor, to which the other ends of the current paths of the fourth bipolar transistor, the fifth bipolar transistor and the sixth bipolar transistor are connected, respectively, a ratio of a resistance value of the first resistor with respect to a resistance value of the second resistor is smaller than a ratio of a resistance value of the fourth resistor with respect to a resistance value of the fifth resistor, and a ratio of a resistance value of the third resistor with respect to the resistance value of the second resistor is smaller than a ratio of a resistance value of the sixth resistor with respect to the resistance value of the fifth resistor.

8. The power amplifier circuit according to claim 1, wherein the push-side driving circuit includes a first bipolar transistor, a second bipolar transistor and a third bipolar transistor, which have current paths connected at one ends to the first driving signal line, the second driving signal line and the third driving signal line, respectively, the pull-side driving circuit includes a fourth bipolar transistor, a fifth bipolar transistor and a sixth bipolar transistor, which have current paths connected at one ends to the first driving signal line, the second driving signal line and the third driving signal line, respectively, a ratio of an emitter area of the fourth bipolar transistor with respect to an emitter area of the fifth bipolar transistor is greater than a ratio of an emitter area of the first bipolar transistor with respect to an emitter area of the second bipolar transistor, and a ratio of an emitter area of the sixth bipolar transistor with respect to the emitter area of the fifth bipolar transistor is greater than a ratio of an emitter area of the third bipolar transistor with respect to the emitter area of the second bipolar transistor.

9. The power amplifier circuit according to claim 8, wherein the push-side driving circuit includes a first resistor, a second resistor and a third resistor, to which the other ends of the current paths of the first bipolar transistor, the second bipolar transistor and the third bipolar transistor are connected, respectively, the pull-side driving circuit includes a fourth resistor, a fifth resistor and a sixth resistor, to which the other ends of the current paths of the fourth bipolar transistor, the fifth bipolar transistor and the sixth bipolar transistor are connected, respectively, a ratio of a resistance value of the fourth resistor with respect to a resistance value of the fifth resistor is smaller than a ratio of a resistance value of the first resistor with respect to the resistance value of the second resistor, and a ratio of a resistance value of the sixth resistor with respect to the resistance value of the fifth resistor is smaller than a ratio of a resistance value of the third resistor with respect to the resistance value of the second resistor.

10. The power amplifier circuit according to claim 1, wherein the push-side driving circuit includes a fifth MOS transistor, a sixth MOS transistor and a seventh MOS transistor, which have current paths connected at one ends to the first driving signal line, the second driving signal line and the third driving signal line, respectively, the pull-side driving circuit includes an eighth MOS transistor, a ninth MOS transistor and a tenth MOS transistor which have current paths connected at one ends to the first driving signal line, the second driving signal line and the third driving signal line, respectively, a ratio of a gate area of the fifth MOS transistor with respect to a gate area of the sixth MOS transistor is greater than a ratio of a gate area of the eighth MOS transistor with respect to a gate area of the ninth MOS transistor, and a ratio of a gate area of the seventh MOS transistor with respect to the gate area of the sixth MOS transistor is greater than a ratio of a gate area of the tenth MOS transistor with respect to the gate area of the ninth MOS transistor.

11. The power amplifier circuit according to claim 1, wherein the push-side driving circuit includes a fifth MOS transistor, a sixth MOS transistor and a seventh MOS transistor, which have current paths connected at one ends to the first driving signal line, the second driving signal line and the third driving signal line, respectively, the pull-side driving circuit includes an eighth MOS transistor, a ninth MOS transistor and a tenth MOS transistor, which have current paths connected at one ends to the first driving signal line, the second driving signal line and the third driving signal line, respectively, a ratio of a gate area of the eighth MOS transistor with respect to a gate area of the ninth MOS transistor is greater than a ratio of a gate area of the fifth MOS transistor with respect to a gate area of the sixth MOS transistor, and a ratio of a gate area of the tenth MOS transistor with respect to the gate area of the ninth MOS transistor is greater than a ratio of a gate area of the seventh MOS transistor with respect to the gate area of the sixth MOS transistor.

12. The power amplifier circuit according to claim 1, wherein the push-side driving circuit includes a fifth MOS transistor, a sixth MOS transistor and a seventh MOS transistor, which have current paths connected at one ends to the first driving signal line, the second driving signal line and the third driving signal line, respectively, the pull-side driving circuit includes an eighth MOS transistor, a ninth MOS transistor and a tenth MOS transistor, which have current paths connected at one ends to the first driving signal line, the second driving signal line and the third driving signal line, respectively, a ratio of a gate width/gate length ratio of the fifth MOS transistor with respect to a gate width/gate length ratio of the sixth MOS transistor is greater than a ratio of a gate width/gate length ratio of the eighth MOS transistor with respect to a gate width/gate length ratio of the ninth MOS transistor, and a ratio of a gate width/gate length ratio of the seventh MOS transistor with respect to the gate width/gate length ratio of the sixth MOS transistor is greater than a gate width/gate length ratio of the tenth MOS transistor with respect to the gate width/gate length ratio of the ninth MOS transistor.

13. The power amplifier circuit according to claim 1, wherein the push-side driving circuit includes a fifth MOS transistor, a sixth MOS transistor and a seventh MOS transistor, which have current paths connected at one ends to the first driving signal line, the second driving signal line and the third driving signal line, respectively, the pull-side driving circuit includes an eighth MOS transistor, a ninth MOS transistor and a tenth MOS transistor, which have current paths connected at one ends to the first driving signal line, a second driving signal line and a third driving signal line, respectively, a ratio of a gate width/gate length ratio of the eighth MOS transistor with respect to a gate width/gate length ratio of the ninth MOS transistor is greater than a ratio of a gate width/gate length ratio of the fifth MOS transistor with respect to a gate width/gate length ratio of the sixth MOS transistor, and a ratio of a gate width/gate length ratio of the tenth MOS transistor with respect to the gate width/gate length ratio of the ninth MOS transistor is greater than a gate width/gate length ratio of the seventh MOS transistor with respect to the gate width/gate length ratio of the sixth MOS transistor.

14. The power amplifier circuit according to claim 1, further comprising:

an eleventh MOS transistor having a gate and a source, which are respectively connected to the gate and a source of the first MOS transistor or the third MOS transistor;

a twelfth MOS transistor having a gate and a source, which are respectively connected to the gate and a source of the second MOS transistor;

a resistor connected between drains of the eleventh MOS transistor and the twelfth MOS transistor and the third power supply line or the first power supply line; and a switch which is turned on/off by the drains of the eleventh MOS transistor and the twelfth MOS transistor and controls connection between the gate of the third MOS transistor and the impedance circuit.

15. A power amplifier circuit comprising:

an input circuit which receives an input signal and a feedback signal, amplifies the input signal and the feedback signal, and outputs a first control signal and a second control signal;

an n-number (n=a natural number of 3 or more) of power supply lines with voltages successively decreasing from a first power supply line to an n-th power supply line;

a push-side driving circuit which is connected to the first power supply line, receives the first control signal, and has an n-number of first driving signal output terminals;

a pull-side driving circuit which is connected to the n-th power supply line, receives the second control signal, and has an n-number of second driving signal output terminals;

an n-number of driving signal lines which are connected between the n-number of first driving signal output terminals of the push-side driving circuit and the n-number of second driving signal output terminals of the pull-side driving circuit, respectively;

an n-number of MOS transistors which have current paths respectively connected at one ends to the n-number of power supply lines, and have gates respectively connected to the n-number of driving signal lines;

an output terminal commonly connected to the other ends of the current paths of the n-number of MOS transistors;

an impedance circuit which includes an (n+1)th MOS transistor, which has a current path connected between the first power supply line and a gate of the first MOS transistor or between the n-th power supply line and a gate of the n-th MOS transistor, has a gate connected to the gate of the first MOS transistor or the n-th MOS transistor, and adjusts a gate impedance of the first MOS transistor or the n-th MOS transistor; and a feedback circuit which is connected between the output terminal and the input circuit and sends the feedback signal to the input circuit.

16. The power amplifier circuit according to claim 15, wherein when the input signal increases, the first control signal decreases output currents of the first driving signal output terminals and the second control signal increases output currents of the second driving signal output terminals.

17. The power amplifier circuit according to claim 15, wherein the first driving signal output terminals and the second driving signal output terminals charge or discharge gate capacitances of the associated MOS transistors via the driving signal lines.

18. The power amplifier circuit according to claim 15, wherein when the input signal is absent, the impedance circuit determines a current that flows to two of the MOS transistors, which are closest to the first power line or the n-th power supply line.

19. The power amplifier circuit according to claim 15, wherein a second power supply line to an (n−1)th power supply line supply a current only in one direction to the associated MOS transistors.

20. The power amplifier circuit according to claim 15, further comprising:
- an (n+2)th MOS transistor having a gate and a source respectively connected to the gate and a source of the first MOS transistor or the n-th MOS transistor;
- a resistor connected between a drain of the (n+2)th MOS transistor and the n-th power supply line or the first power supply line; and
- a switch which is turned on/off by the drain of the (n+2)th MOS transistor and controls connection between the gate of the n-th MOS transistor or the first MOS transistor and the impedance circuit.

* * * * *